United States Patent [19]

Tyan

[11] 4,319,069

[45] Mar. 9, 1982

[54] SEMICONDUCTOR DEVICES HAVING IMPROVED LOW-RESISTANCE CONTACTS TO p-TYPE CdTe, AND METHOD OF PREPARATION

[75] Inventor: Yuan-Sheng Tyan, Webster, N.Y.

[73] Assignee: Eastman Kodak Company, Rochester, N.Y.

[21] Appl. No.: 172,049

[22] Filed: Jul. 25, 1980

[51] Int. Cl.³ .................. H01L 31/04; H01L 31/18
[52] U.S. Cl. .................. 136/258; 136/260; 29/572; 427/74; 427/88; 156/625; 357/30; 357/65; 357/71
[58] Field of Search .......... 136/256, 258, 260; 29/572; 427/88, 89, 74; 156/625; 357/30, 65, 67, 71; 428/620

[56] References Cited

U.S. PATENT DOCUMENTS

| | | | |
|---|---|---|---|
| 3,480,473 | 11/1969 | Tanos | 427/74 |
| 3,767,494 | 10/1973 | Muraoka et al. | 156/657 |
| 3,785,891 | 1/1974 | Vrieze et al. | 156/625 |
| 3,993,533 | 11/1977 | Milnes et al. | 156/613 |
| 4,207,119 | 6/1980 | Tyan | 136/258 |

FOREIGN PATENT DOCUMENTS

| | | | |
|---|---|---|---|
| 2137280 | 10/1972 | Fed. Rep. of Germany | 156/665 |
| 1594268 | 2/1970 | France | 156/664 |
| 50-40832 | 12/1975 | Japan | 156/662 |

OTHER PUBLICATIONS

A. L. Fahrenbruch et al. II–VI Photovoltaic Heterojunctions for Solar Energy Conversion", *Conf. Record*, *11th IEEE Photovoltaic Specialists Conf.* (1975), pp. 490–496.
R. H. Bubes et al., "Photovoltaic Energy Conversion With n–CdS-pCdTe Heterojunctions and Other II–VI Junctions", *IEEE Trans. Electron Devices*, vol. ED-, 24 pp. 484–492 (1977).
R. N. Zitter "Ramon Detection of Tellurium Layers on Surfaces of CdTe", *Surface Science*, vol. 28, pp.335–338 (1971).
R. N. Zitter et al., "Photoeffects in CdTe With Acid--Grown Te Layers", *J. Appl. Phys.*, vol. 46, pp. 1405–1406 (1975).
K. Zanio, "Semiconductors and Semimetals–vol. 13–-Cadmium Telluride", Academic Press, New York (1978), pp. 184–203.
M. Inoue et al., "Etch Pits and Polarity in CdTe Crystals", *J. Appl. Phys.*, vol. 33, pp. 2578–2582 (1962).
T. Ichimiya et al., "Effect of Impurity Doping Upon the Electrical Properties of Cadmium Telluride", *Solid State Phys. Electron Telecommun., Proc. Int. Conf.*, vol. 2, p. 845 (1952).

*Primary Examiner*—Aaron Weisstuch
*Attorney, Agent, or Firm*—Dana M. Schmidt

[57] ABSTRACT

There are disclosed a semiconductor device comprising a layer of polycrystalline p-type CdTe and a variety of metals in low-resistance contact, and a process and preferred etchant for obtaining the contact. A layer comprising tellurium is provided between the metal contact and the layer of p-type CdTe. The surface portion of the CdTe layer adjacent to the tellurium-containing layer is cadmium-deficient, and the grain boundaries of the CdTe layer are preserved intact.

11 Claims, 6 Drawing Figures

FIG. 2
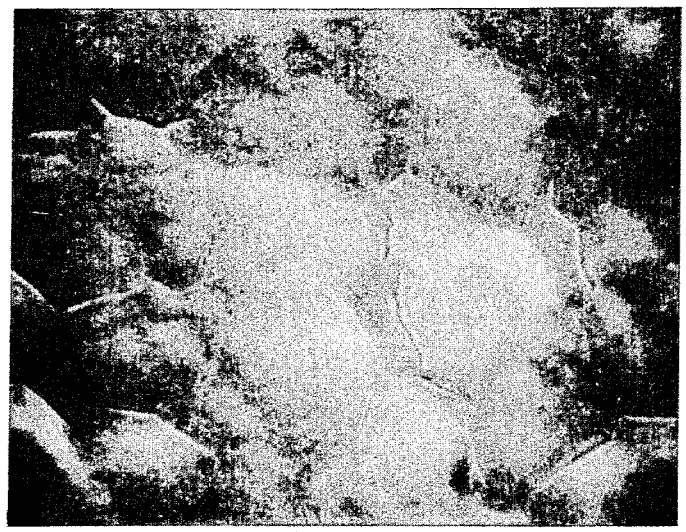
FIG. 3 COMPARATIVE EXAMPLE

SEMICONDUCTOR DEVICES HAVING IMPROVED LOW-RESISTANCE CONTACTS TO P-TYPE CDTE, AND METHOD OF PREPARATION

FIELD OF THE INVENTION

This invention relates to a low-resistance contact for p-type CdTe layers as used in semiconductor devices.

BACKGROUND OF THE INVENTION

Photovoltaic cells of the heterojunction type require the presence of two metal electrodes that make a low-resistance contact with the adjacent semiconductor material. If either metal electrode does not form a low-resistance contact, the characteristic I-V curve is altered and the cell does not function at its maximum potential efficiency. Of particular interest is the p-type CdTe/n-type CdS cell, because of the high conversion efficiencies that are now available as reported in my U.S. Pat. No. 4,207,119, issued June 10, 1980. One commercial drawback with such a cell has been that the preferred metal for making ohmic contact with the p-type CdTe layer has been gold, as it provides the lowest contact resistance for p-type CdTe when the preparation methods of my aforesaid patent are carried out. Other metals are useful, but they have been less desirable because their contact resistance is substantially greater. That is, a cell that uses a metal other than gold for the ohmic contact with p-type CdTe, can incur as much as a 50% loss in conversion efficiency. While such a cell is still functional, its low efficiency makes it uneconomical.

However, at least due to the rapid rise in the cost of gold, gold contacts are not economical. Therefore, there is a need to provide contacts between other less expensive metals and p-type CdTe, wherein contact with such metals have as low a resistance as the contact obtained when using gold as the electrode material.

Some study has been done concerning contacts for p-type CdTe layers. Although there was some success in contacting p-type CdTe in the single crystal form, low-resistance contact to polycrystalline, thin-film samples is recognized in *Semiconductors & Semimetals*, Zanio (1978), p. 203, as being much more difficult.

In the methods developed for making contacts to single-crystal CdTe samples, a chemical etching step often has been used. The etchants used, however, are unsuitable for thin-film or polycrystalline samples. They either etch away the material so rapidly that much of the thin-film sample is removed, constituting waste and a danger of destroying the entire film; or attack the grain boundary of the CdTe selectively, causing a high concentration of defects. Hot $HNO_3$ is an example of such an etchant.

SUMMARY OF THE INVENTION

In accordance with the present invention, a thin-film semiconductor device is prepared in which any metal can be used to make a low-resistance contact to a layer of p-type CdTe.

In accordance with a related aspect of the invention, there is advantageously provided a method and an etchant for modifying a layer of p-type CdTe so that any metal can be applied thereto to make a low-resistance contact.

These results are achieved in an improved device comprising a layer of polycrystalline p-type CdTe and a layer of metal in low-resistance contact with the CdTe layer. The improvement resides in the use of a layer comprising tellurium disposed between and in contact with the CdTe layer and the metal layer, and wherein the surface portion of the CdTe layer in contact with the tellurium layer is cadmium-deficient and the CdTe layer has intact grain boundaries.

A preferred method for obtaining such a device comprises the steps of (a) selectively dissolving cadmium from the exterior portion of an initial CdTe layer to form a layer of tellurium while (i) leaving intact the grain boundaries of the CdTe and (ii) modifying the surface portion of the remaining CdTe in contact with the tellurium to render that portion cadmium-deficient, and (b) applying a layer of metal in contact with and over the tellurium layer.

The above-noted method is preferably carried out using an etchant comprising a mixture of $HNO_3$ or salts thereof and a leveling agent.

Additional advantages will become apparent upon reference to the following Description of the Preferred Embodiments, when read in light of the attached Drawings.

BRIEF DESCRIPTION OF THE DRAWINGS

FIGS. 2-3 are scanning electron microphotographs at 10,000 enlargement, of a polycrystalline CdTe layer remaining either after preparing the device of FIG. 1, (FIG. 2) or after processing the CdTe layer using a control (FIG. 3)

DESCRIPTION OF THE PREFERRED EMBODIMENTS

The invention is hereinafter described by particular reference to a photovoltaic cell using polycrystalline semiconductors, a preferred embodiment. It is however applicable to any semiconductor device wherein a layer of metal is to make a low-resistance contact to p-type crystalline CdTe that is in bulk or thin-film form, for use in transistors, diodes and the like, as well as photovoltaic cells. The preferred devices are thin-film devices.

As used herein, "low-resistance contact" means a contact in which (for the operative voltages of the semiconductor device) the resistance in question is less than 20 ohms-$cm^2$.

It has been found that a layer comprising tellurium present between and in contact with the p-type CdTe layer and the metal layer forming the contact, insures a useful low-resistance contact regardless of the metal used, provided either (a) the surface portion of a CdTe layer adjacent to the tellurium layer is cadmium-deficient or (a'), the tellurium is formed by selectively dissolving the cadmium from a CdTe layer, and (b) the grain boundaries of the remaining CdTe are left intact.

Figure 1:
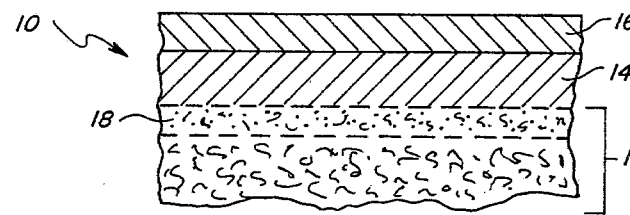
FIG. 1 is a fragmentary, partially schematic sectional view illustrating a semiconductor device prepared in accordance with the invention.

Thus, a semiconductor device 10 produced in accordance with the invention and shown in FIG. 1, comprises an operative layer 12 of polycrystalline p-type CdTe, a layer 14 comprising tellurium in contact with the CdTe layer, and a layer 16 of any metal in contact with layer 14. The surface portion 18 of layer 12 is believed to be cadmium-deficient because of the selective dissolving of Cd. The most preferred metals for layer 16 are those selected from the group consisting of silver, nickel, chromium, copper, tin, aluminum, gold, titanium, lead, stainless steel, nickel alloys and various other industrial alloys.

The reasons that a low-resistance contact is made when metals other than gold are used, are not clear. This property is derived from the tellurium layer being formed by selectively dissolving cadmium from an initial CdTe layer using, for example, an appropriate etchant. Further, this property is not present if the tellurium layer is formed by depositing the tellurium from the vapor phase onto the CdTe layer, a process that is not effective to produce a low-resistance contact without regard to the metal selected. Rather, the latter process produces contacts having much greater than 20 ohms-cm$^2$ resistance.

Preferred etchants are those comprising a solution mixture of $HNO_3$ or salts thereof, and a leveling agent. As used herein, "leveling agent" refers to a material useful for chemical or electrolytic polishing of metals or alloys. A variety of leveling agents are useful, such as glacial acetic acid and, most preferably, concentrated $H_3PO_4$. A range of concentrations of $HNO_3$ or nitrate salts are useful in this mixture with $H_3PO_4$, the most preferred concentration being between about 0.10 and about 5.0 percent of the etchant. It is surprising that such small amounts of $HNO_3$ are effective in forming the useful tellurium layer. Previous literature articles report that much higher concentrations of $HNO_3$, when $HNO_3$ is used alone, are necessary.

Useful nitrate salts include zinc nitrate, cupric nitrate, lead nitrate and mercuric nitrate.

As will be apparent from the preceding, the preferred method of obtaining the selective dissolving of the cadmium comprises etching the CdTe layer with the etchant described above. Room temperatures are preferred for this process, although slightly higher or lower temperatures are also useful. Preferably, the length of time of the etching is between about 5 seconds and about 2 minutes.

FIG. 2 illustrates the condition of the grain boundaries of a CdTe layer after using the etchant and process of the invention. The CdTe layer depicted was photographed, face on, after the process of this invention was applied to modify an initial CdTe layer as described. The tellurium-containing layer is still present but cannot be seen in an electron microphotograph. It will be apparent that the grain boundaries of CdTe are essentially identical to those existing in a freshly deposited CdTe layer. That is, they are intact and substantially without degradation. In contrast, the use of an acid etchant lacking the leveling agent, such as 18% nitric acid used for 30 sec at room temperature without $H_3PO_4$, produces a layer, FIG. 3, in which cracks along grain boundaries and other crystalline defects, such as can lead to shorts, have started to appear.

The thickness of the tellurium layer is not believed to be critical. Preferred thicknesses range from 5 to 500 Å.

The amount of cadmium deficiency that occurs in layer 18 of the device of FIG. 1, or the depth of that layer, do not appear to be critical. The actual amount of cadmium lost from the CdTe layer 18 will depend partly on the length of the time used to selectively dissolve the cadmium, and the effectiveness of the dissolving medium. For purposes of this invention, the presence of the cadmium-deficient layer is detectable by comparing the photoluminescence spectra of the CdTe layer modified in accordance with this invention, against the spectra produced by the freshly formed CdTe layer immediately before processing to form the tellurium-containing layer. A marked difference in the spectra is reproducibly detected. This difference is consistent with the interpretation that the layer is cadmium-deficient, because relative excess amounts of Te, rather than Cd, produce properties that should assist, from a theoretical basis, in making a low-resistance contact to the p-type CdTe layer.

The metal contact layer is applied by any conventional technique, such as by vacuum deposition.

Photovoltaic cells prepared in accordance with this invention comprises, for example, the heterojunction cell of my aforesaid U.S. Pat. No. 4,207,119. That is, underneath the layer of p-type CdTe is a polycrystalline layer of n-type CdS, in ohmic contact with a transparent or semi-transparent layer of tin oxide or indium oxide as described in said patent, the details of which are expressly incorporated herein by reference.

EXAMPLE

The following example further illustrates the invention in light of the following controls.

CONTROL 1

Figure 4:
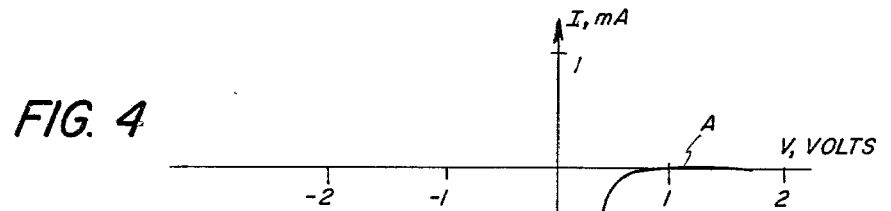
FIGS. 4-6 are graphs of output current versus voltage, indicating the improvement obtained by the invention.

A photovoltaic cell comprising a p-type CdTe layer and an n-type CdS layer was made following the teaching of my aforesaid U.S. Pat. No. 4,207,119, with the exception that the final Au electrode was not applied. A thin Ni layer ($\sim 500$ Å) was evaporated, using conventional vacuum evaporation, as the positive electrode to complete the construction of the cell. The cell area was 0.1 cm$^2$. The current-voltage curve of this device under illumination was measured and presented in FIG. 4. The current saturation in the forward direction (portion A) clearly indicated an unacceptable rectifying contact between the Ni and the p-type CdTe. The conversion efficiency was only about 4%.

CONTROL 2

Figure 5:
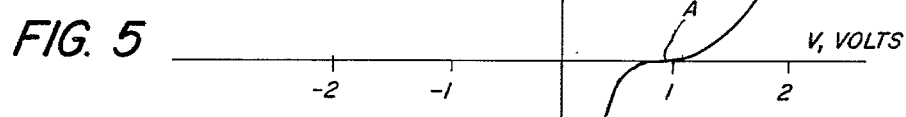

A cell was made following the same procedure of Control 1, with the exception that a thin Te layer ($\sim 200$ Å) was deposited, using conventional vacuum deposition, onto the p-type CdTe surface prior to the deposition of the Ni layer. Again a rectifying contact to p-type CdTe is indicated by the I-V curve of the device (portion A of FIG. 5). The conversion efficiency was only about 3%.

EXAMPLE 1

Figure 6:
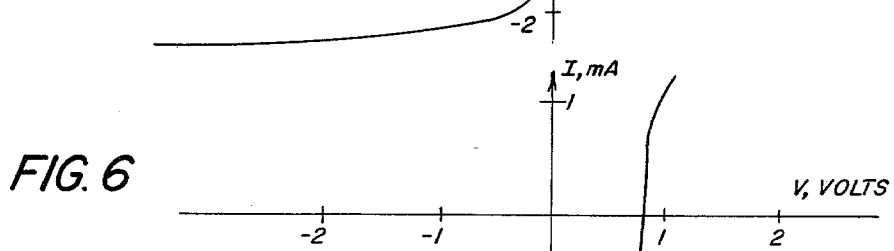

A cell was made following the procedure of Control 1, with the exception that the p-CdTe surface was dipped into a solution consisting of 1.25 ml of concentrated $HNO_3$ and sufficient concentrated $H_3PO_4$ to total 100 ml, for 30 sec at room temperature, rinsed and air dried prior to the deposition of the Ni layer. The I-V curve indicated a much improved contact to the p-type CdTe layer (FIG. 6). Furthermore, the conversion efficiency was increased to about 10% compared to the low values for Controls 1 and 2, demonstrating further the lower contact resistance obtained by this Example compared to the Controls. That is, the higher conversion efficiency results from a lower contact resistance, as is well known.

CONTROL 3

As a final comparison, the procedure of Example 1 was repeated, except the etchant comprised only 100 ml of concentrated $H_3PO_4$. After 5 minutes of exposure of the CdTe layer to this etchant, no discernable change was noted. Clearly, the $H_3PO_4$ by itself was not effective, not even in the amounts used in the effective etchant composition.

The invention has been described in detail with particular reference to preferred embodiments thereof, but it will be understood that variations and modifications can be effected within the spirit and scope of the invention.

What is claimed is:

1. In a semiconductor device comprising a layer of polycrystalline p-type CdTe and a layer of metal in low-resistance contact with said CdTe layer,
    the improvement wherein a layer comprising tellurium is disposed between and in contact with said CdTe layer and said metal layer, and wherein the surface portion of said CdTe layer in contact with said tellurium layer is cadmium-deficient, with intact grain boundaries.

2. In a semiconductor device comprising an operative layer of polycrystalline p-type CdTe and a layer of metal in low-resistance contact with said CdTe layer,
    the improvement comprising a layer comprising tellurium disposed between and in contact with said CdTe layer and said metal layer, said tellurium-comprising layer being formed by selectively dissolving cadmium from the exterior portion of an initial CdTe layer, and said operative CdTe layer being characterized by intact grain boundaries.

3. A device as defined in claim 1 or 2, wherein said metal is selected from the group consisting of silver, nickel, chromium, copper, tin, aluminum, gold, titanium, lead, stainless steel, and nickel alloys.

4. A device as defined in claim 2, wherein said tellurium-comprising layer is formed by etching said CdTe layer with a mixture of $HNO_3$ or salts thereof, and a leveling agent.

5. A device as defined in claim 4, wherein said leveling agent is concentrated $H_3PO_4$.

6. A device as defined in claim 5, wherein said mixture has a concentration of between about 0.10 and about 5.0 percent of nitric acid.

7. A device as defined in claim 1 or 2, wherein said device is a photovoltaic cell.

8. In a thin film photovoltaic cell comprising an operative layer of polycrystalline p-type CdTe and a layer of metal in low-resistance contact with said CdTe layer,
    the improvement wherein a layer comprising tellurium is disposed between and in contact with said CdTe layer and said metal layer, and wherein the surface portion of said CdTe layer in contact with said tellurium layer is cadmium-deficient, with intact grain boundaries, said tellurium-comprising layer being formed by selectively etching said initial CdTe layer with a mixture of $HNO_3$ and concentrated $H_3PO_4$, whereby the grain boundaries of said operative CdTe layer remain intact.

9. A cell as defined in claim 8, wherein said mixture has a concentration of between about 0.10 and about 5.0 percent of nitric acid.

10. A method of making a low-resistance contact between a metal and an operative layer of polycrystalline p-type CdTe, comprising the steps of
    (a) selectively dissolving cadmium from the exterior portion of an initial p-type polycrystalline CdTe layer to form a layer comprising tellurium while (i) leaving intact the grain boundaries of remaining CdTe and (ii) modifying the surface portion of said remaining CdTe in contact with said tellurium-containing layer to render said surface portion cadmium-deficient, and
    (b) applying a layer of metal in contact with and over said tellurium-containing layer.

11. A method as defined in claim 10, wherein said dissolving step comprises the step of etching said initial CdTe layer with a mixture of $HNO_3$ or salts thereof and a leveling agent to convert the exposed portion of said CdTe layer into a layer comprising tellurium.

* * * * *